(12) United States Patent
Lyden et al.

(10) Patent No.: US 7,795,960 B2
(45) Date of Patent: Sep. 14, 2010

(54) LOW POWER, LOW NOISE AMPLIFIER SYSTEM

(75) Inventors: Colin G. Lyden, Baltimore (IE); Christian S. Birk, Innishannon (IE); Tomas Tansley, San Francisco, CA (US)

(73) Assignee: Analog Devices, Inc., Norwood, MA (US)

( * ) Notice: Subject to any disclaimer, the term of this patent is extended or adjusted under 35 U.S.C. 154(b) by 77 days.

(21) Appl. No.: 12/283,511

(22) Filed: Sep. 12, 2008

(65) Prior Publication Data
US 2009/0115522 A1   May 7, 2009

Related U.S. Application Data

(60) Provisional application No. 60/993,745, filed on Sep. 14, 2007, provisional application No. 60/994,077, filed on Sep. 17, 2007.

(51) Int. Cl.
*H03F 1/02* (2006.01)

(52) U.S. Cl. .......................................... 330/9

(58) Field of Classification Search ............... 330/9, 330/85; 327/124
See application file for complete search history.

(56) References Cited

U.S. PATENT DOCUMENTS 5,495,149 A    2/1996 Hiramatsu et al.
7,038,532 B1 *  5/2006 Bocko et al. ............... 327/554
7,233,772 B1    6/2007 Darabi et al.
7,456,684 B2 * 11/2008 Fang et al. ..................... 330/9
7,589,587 B2 *  9/2009 Yoshida et al. ................ 330/9
2006/0232331 A1 10/2006 Thompson et al.

OTHER PUBLICATIONS

Harrison et al., A Low-Power Low-Noise CMOS Amplifier for Neural Recording Applications, IEEE Journal of Solid State Circuits, vol. 38, No. 6, Jun. 2003, pp. 958-965.

* cited by examiner

*Primary Examiner*—Steven J Mottola
(74) *Attorney, Agent, or Firm*—Kenyon & Kenyon LLP

(57) ABSTRACT

A low power, low noise amplifier system includes at least one amplifier having first and second differential input terminals, first and second differential output terminals and providing a differential output; first and second input capacitors interconnected with the first and second differential amplifier input terminals; first and second feedback circuits containing first and second feedback capacitors, respectively, interconnected with the amplifier differential input and output terminals; an input chopper switch circuit for receiving a low frequency differential input and selectively, alternately swapping those low frequency differential inputs through the input capacitors to the differential input terminals of the amplifier; an output chopper switch for receiving and selectively, alternately swapping the amplifier differential outputs synchronously with the input chopper switch circuit; and a low pass filter responsive to the swapped differential outputs for providing a low noise, low power amplification of the low frequency differential inputs.

15 Claims, 7 Drawing Sheets

US 7,795,960 B2

LOW POWER, LOW NOISE AMPLIFIER SYSTEM

RELATED APPLICATIONS

This application claims benefit of and priority to U.S. Provisional Application Ser. No. 60/993,745 filed Sep. 14, 2007 and 60/994,077 filed Sep. 17, 2007 which are incorporated herein by this reference.

FIELD OF THE INVENTION

This invention relates to an improved low noise, low power amplifier system and more particularly to such an improved low noise, low power amplifier system which enables more precise control over gain levels.

BACKGROUND OF THE INVENTION

Amplifiers with capacitor defined gain have advantages over resistor implemented amplifiers as capacitors do not introduce noise as resistors do nor do they introduce the self heating problem that resistors do. Capacitor implemented amplifiers are very stable and if the signal varies slowly e.g. 100 Hz there can be generally a naturally high input impedance. They are also easy to drive using lower current. One shortcoming of such devices is that they do not perform well at low and near d.c. frequencies. If a low frequency signal is introduced into a capacitor the current will be very small and easily overwhelmed by stray noise current. See A LOW-POWER LOW-NOISE CMOS AMPLIFIER FOR NEURAL RECORDING APPLICATIONS by Harrison et al., IEEE Journal of Solid State Circuits, Vol. 38, No. 6, June 2003, pages 958-965 incorporated herein in its entirety by this reference.

SUMMARY OF THE INVENTION

It is therefore an object of this invention to provide an improved low noise, low power amplifier system.

It is a further object of this invention to provide such an improved low noise, low power amplifier system which is capable of precisely amplifying even low, and near d.c. frequencies and even d.c.

It is a further object of this invention to provide such an improved low noise, low power amplifier system which employs a differential approach and can independently control input common mode and output common mode levels.

It is a further object of this invention to provide such an improved low noise, low power amplifier system which has high input common mode rejection.

It is a further object of this invention to provide such an improved low noise, low power amplifier system which has rail to rail input range limited only by the switches.

The invention results from the realization that an improved low power, low noise amplifier system which obtains the advantages of a capacitor gain amplifier even at low, near d.c. frequencies and even at d.c. can be achieved using at least one differential amplifier with capacitor feedback whose input is coupled to an input chopper and whose output is coupled to an output chopper which choppers synchronously, selectively, alternately swap the differential input and output of the amplifier and deliver it through a low pass filter.

The subject invention, however, in other embodiments, need not achieve all these objectives and the claims hereof should not be limited to structures or methods capable of achieving these objectives.

This invention features a low power, low noise amplifier system including at least one amplifier having first and second differential input terminals, first and second differential output terminals and providing a differential output. First and second input capacitors are interconnected with the first and second differential amplifier input terminals. First and second feedback circuits containing first and second feedback capacitors, respectively, are interconnected with the amplifier differential input and output terminals. An input chopper switch circuit receives a low frequency differential input and selectively, alternately swaps those low frequency differential inputs through the input capacitors to the differential input terminals of the amplifier. An output chopper switch receives and selectively, alternately swaps the amplifier differential outputs synchronously with the input chopper switch circuit. A low pass filter responsive to the swapped differential outputs provides a low noise, low power amplification of the low frequency differential inputs.

In a preferred embodiment the amplifier system may further include a second amplifier having third and fourth differential input terminals, third and fourth differential output terminals and provides a differential output. Third and fourth input capacitors are interconnected with the third and fourth differential amplifier input terminals. Third and fourth feedback circuits containing third and fourth feedback capacitors, respectively, are interconnected with the amplifier differential input and output terminals. The first and second feedback circuits may include a resistor in parallel with each feedback capacitor. The first and second feedback circuits may include a pseudo resistance element in parallel with each feedback capacitor. The input and output chopper switch circuits may be switched at a frequency that is substantially higher than the highest frequency component of the input signal. The amplifier system may further include an analog to digital converter coupled to the low pass filter output with the analog to digital converter having a sampling bandwidth that is greater than the bandwidth of the low pass filter. The amplifier system may further include a common mode feedback and offset cancellation circuit for setting the input common mode independently of the output common mode levels of the amplifier and compensating for the amplifier offset. The common mode feedback and offset cancellation circuit may include a differential output low pass filter responsive to the amplifier offset, a common mode voltage reference for defining the input common mode level, a summing circuit for combining the differential output low pass filter outputs with the common mode voltage reference, first and second voltage buffers responsive to the summing circuit, and first and second level setting resistors responsive to the first and second buffers, respectively, to apply the combined input common mode levels and offset compensation to the amplifier input terminals. The low pass filter may include a pair of capacitors, an input filter chopper circuit for selectively, alternately interconnecting the differential output of the amplifier to the capacitors and an output filter chopper circuit for selectively, alternately interconnecting the capacitors to the summing circuit in synchronism with the input filter chopper circuit and the input and output chopper circuits. The common mode feedback and offset cancellation circuit may include a common mode voltage reference interconnected with one input terminal of the amplifier to control the input common mode voltage level and an error amplifier responsive to the differential output of the low pass filter interconnected with the other input terminal of the amplifier to compensate for amplifier offset.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
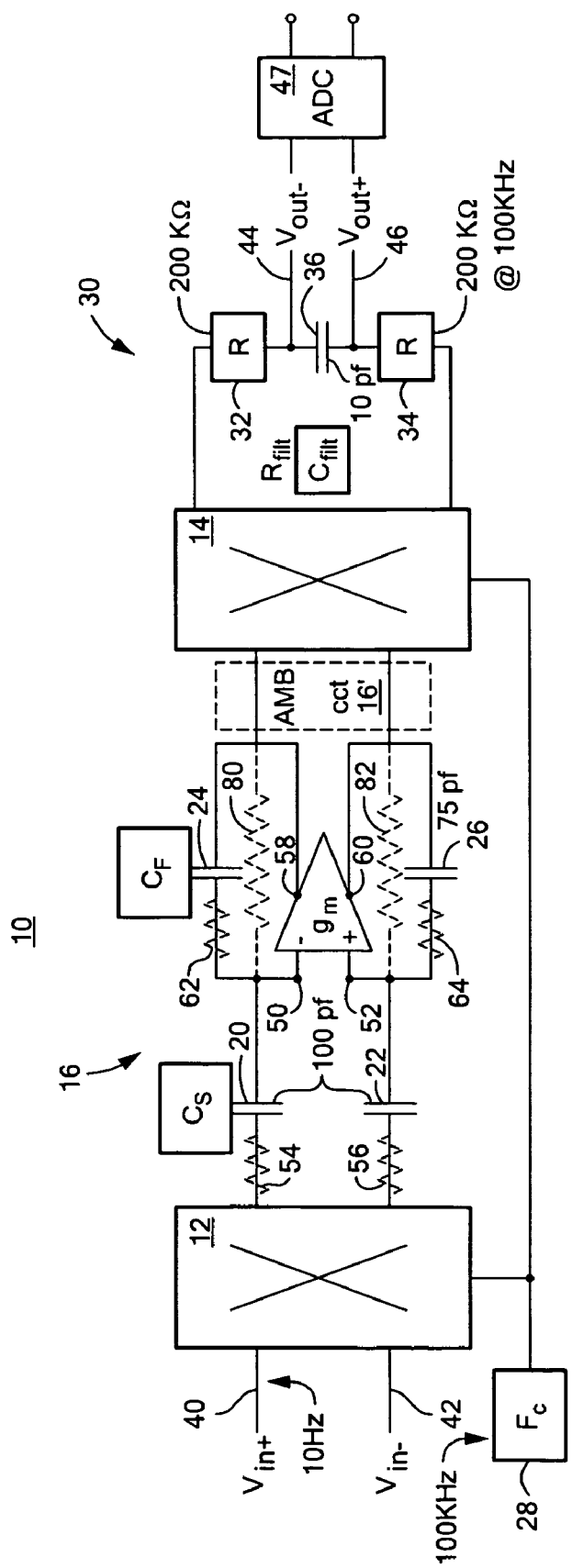
FIG. 1 is a schematic diagram for an improved amplifier system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 an improved low power, low noise amplifier system 10, according to this invention which includes an input chopper switch circuit 12, also known as a swapper or cross point switch and an output chopper switch circuit 14. Between chopper switch circuits 12 and 14 is a capacitive gain amplifier circuit 16 including differential transconductance amplifier 18, having input capacitors 20 and 22 and feedback capacitors 24 and 26. The gain of amplifier 18 is a function of the ratio of capacitor 20 to capacitor 24 and capacitor 22 to capacitor 26. For example, the feedback capacitors 24 and 26 could be 2 pF and the input capacitors 20, 22 could be 20 pF for a gain of 10 or the input capacitors 20, 22 could be 200 pF for a gain of 100. Chopper switch circuits 12 and 14 are operated in synchronism by a clock signal from clock 28 having a frequency $F_c$, that is substantially higher than the highest frequency component of the input signal, for example, 100 kHz. Preferably the output chopper switch circuit 14 makes after the input chopper switch circuit 12 breaks to allow amplifier 18 to settle. The entire system 10 operates differentially and provides an output from output chopper switch circuit 14 to output filter 30 which includes a pair of resistors 32, 34 with capacitor 36 between them. The differential inputs to input chopper switch circuit 12 are labeled $V_{in+}$ 40, $V_{in-}$ 42 while the differential output is labeled $V_{out-}$ 44 and $V_{out+}$ 46. At an operating frequency of 100 kHz typically capacitor 36 will be 10 pF and filter resistors 32 and 34 could be 200 kΩ. In operation the differential input at 40, 42 is chopped by input chopper switch circuit 12, which is interconnected through capacitor 20 and 22 to the differential input of amplifier 18. The output of input chopper switch circuit 12 is shown interconnected directly to input capacitors 20, 22 and then to the input terminals 50, 52 of amplifier 18, but this is not a necessary limitation. For example, resistances 54, 56 may be disposed in series with input capacitors 20 and 22. Similarly while feedback capacitors 24 and 26 are shown directly interconnected between the input terminals 50, 52 and the output terminals 58, 60 of amplifier 18 this is not a necessary limitation as there may be resistors 62, 64, shown in phantom, in series with those feedback capacitors. After the chopped signal is gained up by amplifier 18 by a ratio of capacitor 20 to capacitor 24 or capacitor 22 to capacitor 26, the amplified output is delivered to the output chopper switch circuit 14 which then delivers it to filter 30.

Clock 28 provides a two phase signal, in the first phase the inputs 40, 42 are connected straight through input chopper switch circuit 12 and straight through output chopper switch circuit 14. In the other phase inputs 40 and 42 are crossed so that input 40 goes to capacitor 22 and input 42 goes to capacitor 20. Likewise in that other phase output chopper switch circuit 14 is crossed. In this way the low noise, low current demands of a capacitive gain amplifier are achieved while permitting low frequency, for example 10 Hz, near d.c. or even d.c. inputs to be processed.

Frequently the improved amplifier system 10, FIG. 1, is coupled at its output with an analog to digital converter (ADC) 47. Analog to digital converter 47 will have a sampling bandwidth that is greater than the bandwidth of the low pass filter. By chopping the lower frequency or d.c. input to higher frequencies there results larger signal currents because the capacitors don't pass very much d.c. current. This results in a more precise gain. Although only one amplifier circuit 16 is shown there may be two or more stages as indicated by second stage amplifier circuit 16'.

Figure 2:
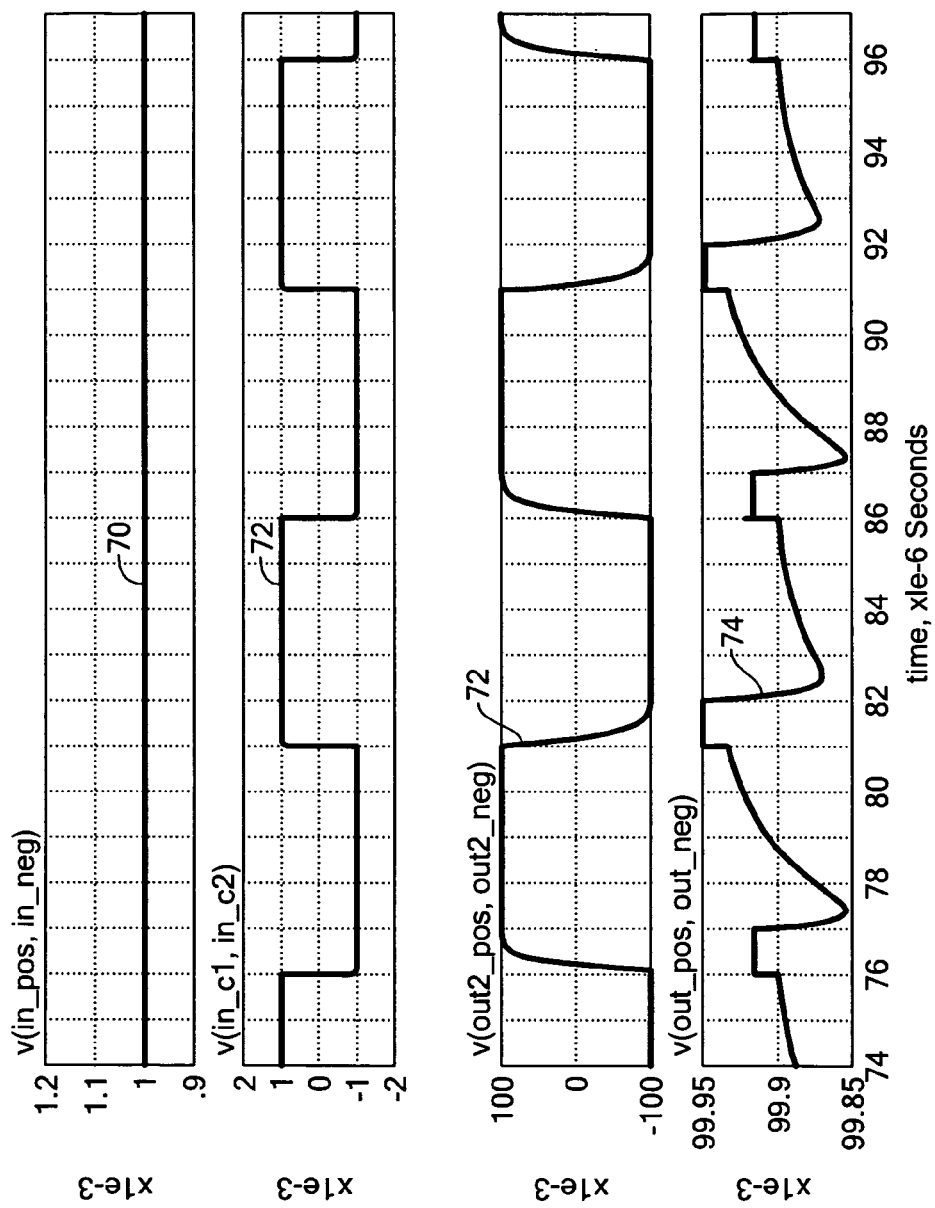
FIG. 2 is a set of traces of signals occurring in the system of FIG. 1.

The efficacy of this improved amplifier 10, FIG. 1, can be seen with reference to FIG. 2 which is a family of traces showing the signals throughout the system. Assuming a differential input of 1 millivolt d.c. $V_{in}$ 70 which is the input to input chopper switch circuit 12, the output of that input chopper switch 12 appears as the essentially square wave 72. This is passed through input capacitors 20 and 22 to the input of amplifier 18. Assuming a ratio of capacitor 20 to capacitor 24 and capacitor 22 to capacitor 26 of 100 to 1 there will be a gain of 100 so that the output 72 of amplifier 18 will swing between +100 and −100 millivolts. This is submitted to output chopper switch circuit 14 and after "de-chopping" appears as at 74 which is greatly magnified but shows that the output to filter 30 is between 99.85 and 99.95 millivolts, an excellent result.

The feedback circuit in FIG. 1, including feedback capacitors 24 and 26, may further include feedback resistors 80, 82 in parallel with feedback capacitors 24 and 26. These are typically very high impedance devices, 1 GΩ or greater. These present a very large impedance effecting only a unity gain but allow a very small current to flow when there is a difference between the input and output of amplifier 18. These feedback circuits have very little current noise and present very high impedance at 100 kHz. The use of a 1 GΩ resistor allows d.c. to flow at very low frequency when the feedback capacitor is blocking. Without that feedback resistor the input could saturate the amplifier.

Figure 3:
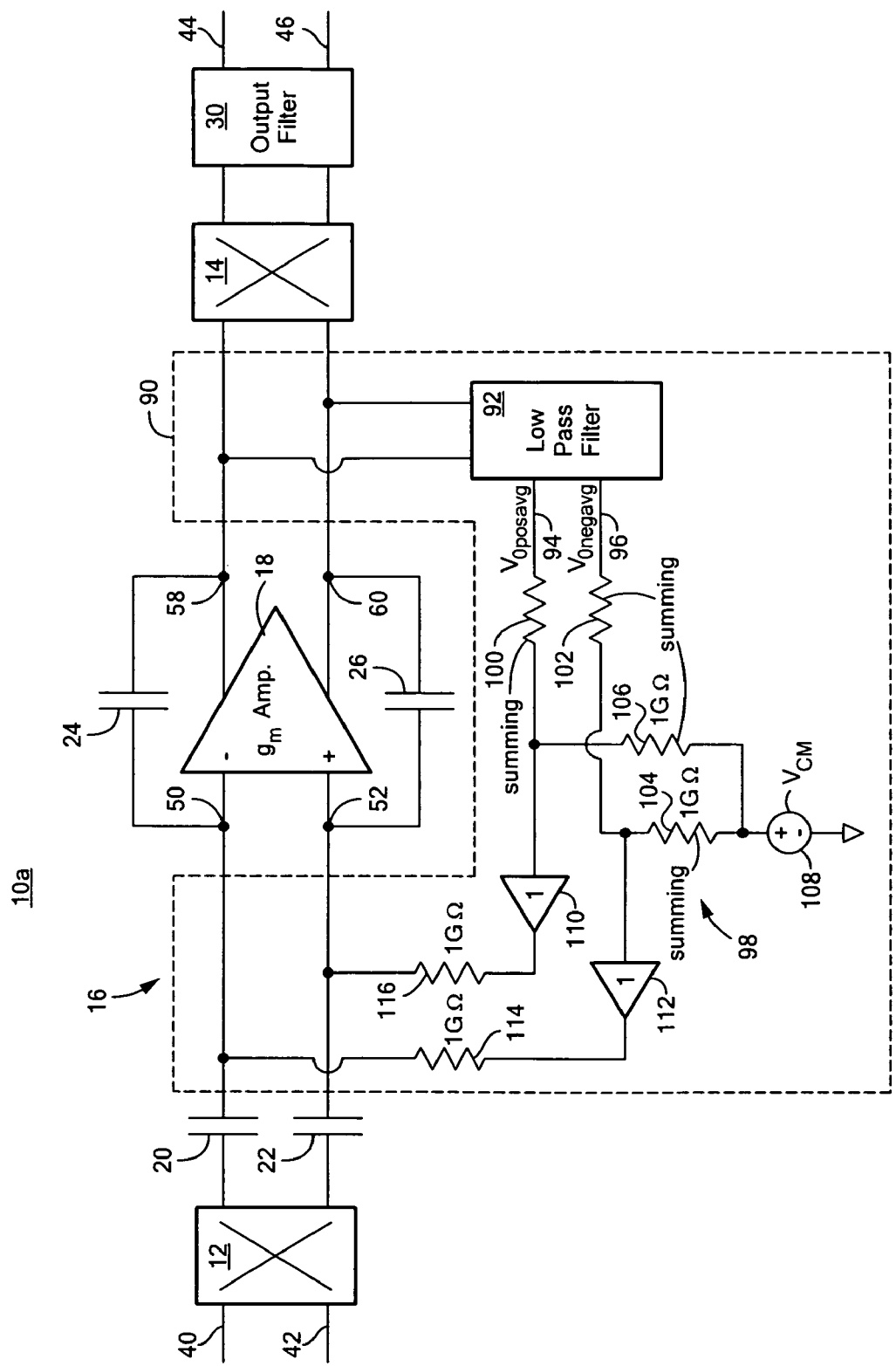
FIG. 3 is a schematic diagram of an another version of the invention of FIG. 1 employing chopped input common mode feedback and offset compensation.

This invention also contemplates a common mode feedback and offset cancellation circuit 90, FIG. 3. Common mode feedback and offset cancellation circuit 90 includes low pass filter, 92, which receives the differential output of amplifier 18 and provides time averaged positive and negative averages $V_{0posavg}$ 94 and $V_{0negavg}$ 96 to a summing circuit 98 including series summing resistors 100 and 102 and parallel summing resistors 104, 106 which may be in the neighborhood of 1 GΩ and are both connected to the output of voltage reference 108 which provides the common mode reference voltage $V_{cm}$. These time averaged positive and negative outputs on lines 94 and 96 and the common mode voltage from source 108 are combined in the summing circuit 98 and delivered to buffers 110 and 112 which through level setting resistors 114 and 116, typically 1 GΩ, are interconnected to the differential input amplifier 18 and thus provide for any offset of amplifier 18 as well as compensation for the time average drift of the differential output.

Figure 4:
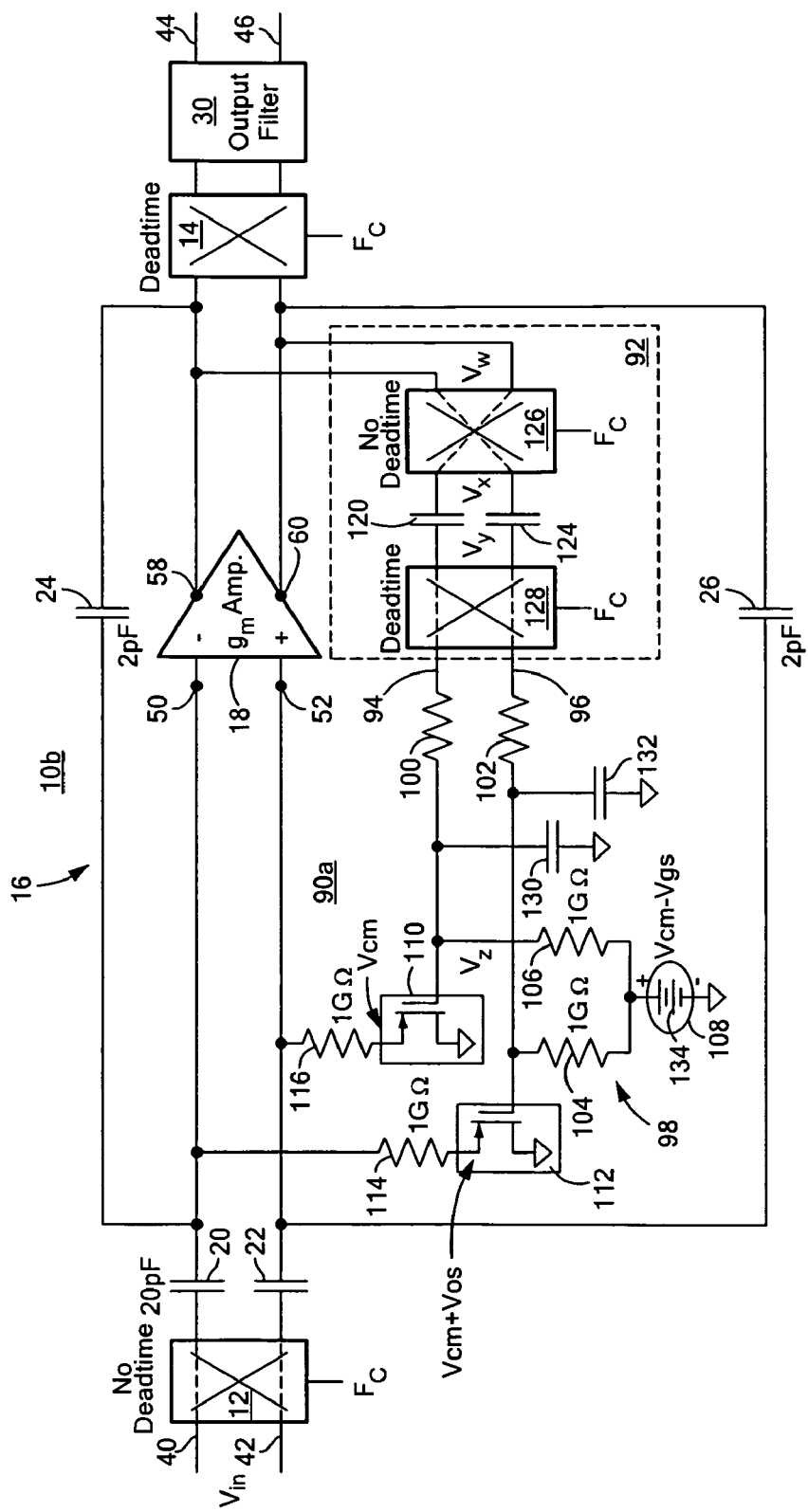
FIG. 4 is a schematic diagram showing the low pass filter of FIG. 3 in more detail.

Low pass filter 92 is shown in greater detail in FIG. 4, as including capacitors 120, 124 between an input filter chopper switch circuit 126 and output filter chopper switch circuit 128. The differential output from amplifier 18 is fed to input filter chopper switch circuit 126 whose output is interconnected through capacitors 120 and 124 to output filter chopper switch circuit 128 whose output in turn provides the time averaged outputs at 94 and 96 to summing circuit 98. In this particular case summing circuit 98 has added filter capacitors 130 and 132. Common mode reference voltage source 108 is shown as a battery 134 and voltage buffers 110 and 112 are shown implemented with field effect transistors. Chopper switch circuits 126, and 128 are operated by clock circuit $F_c$ from clock 28, FIG. 1, as are chopper switch circuits 12 and 14, FIG. 4, all of which are operated in synchronism. In this embodiment with but one amplifier circuit 16 input chopper switch circuit 12 is connected straight through while input chopper switch circuit 14 is crossed. Were there two stages the double inversion would require the output chopper switch 14 to be connected straight through also. Input filter chopper circuit 126 is crossed while output filter chopper circuit 128 is connected straight through.

Figure 5:
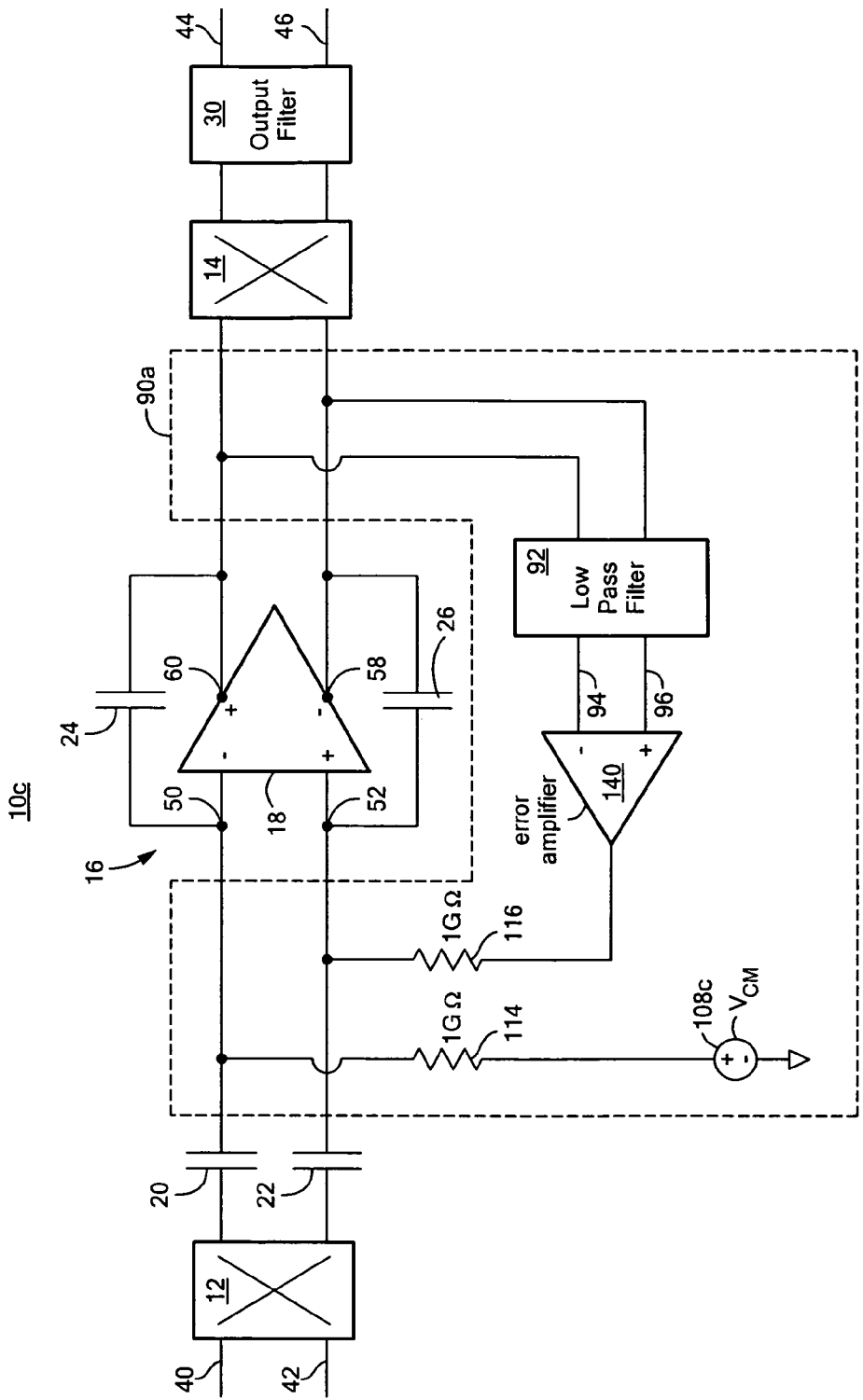
FIG. 5 is a view similar to FIG. 3 showing another version of chopped input common mode feedback and offset compensation.

The output of common mode feedback and offset cancellation circuit 90 in FIG. 3, and 90a in FIG. 4 provides common mode voltage equally to both differential inputs through level setting resistors 114 and 116 and the offset correction is also split between the input terminals 50, 52 of amplifier 18, but this is not a necessary limitation of the invention. For example, as shown in FIG. 5 where the summing circuits and voltage buffers of FIG. 3 have been replaced with error amplifier 140. Here the common mode voltage reference $V_{cm}$ 108a is connected through 1 GΩ resistor 114 directly to one input 50 of amplifier 18 so that it introduces the compensation common mode voltage signal on one of the differential inputs only. Similarly the time averaged offset error output of error amplifier 140 is delivered through 1 GΩ resistor 116 to the other input terminal 52 of amplifier 18 so that the offset cancellation occurs on only one of the differential inputs.

Figure 6:
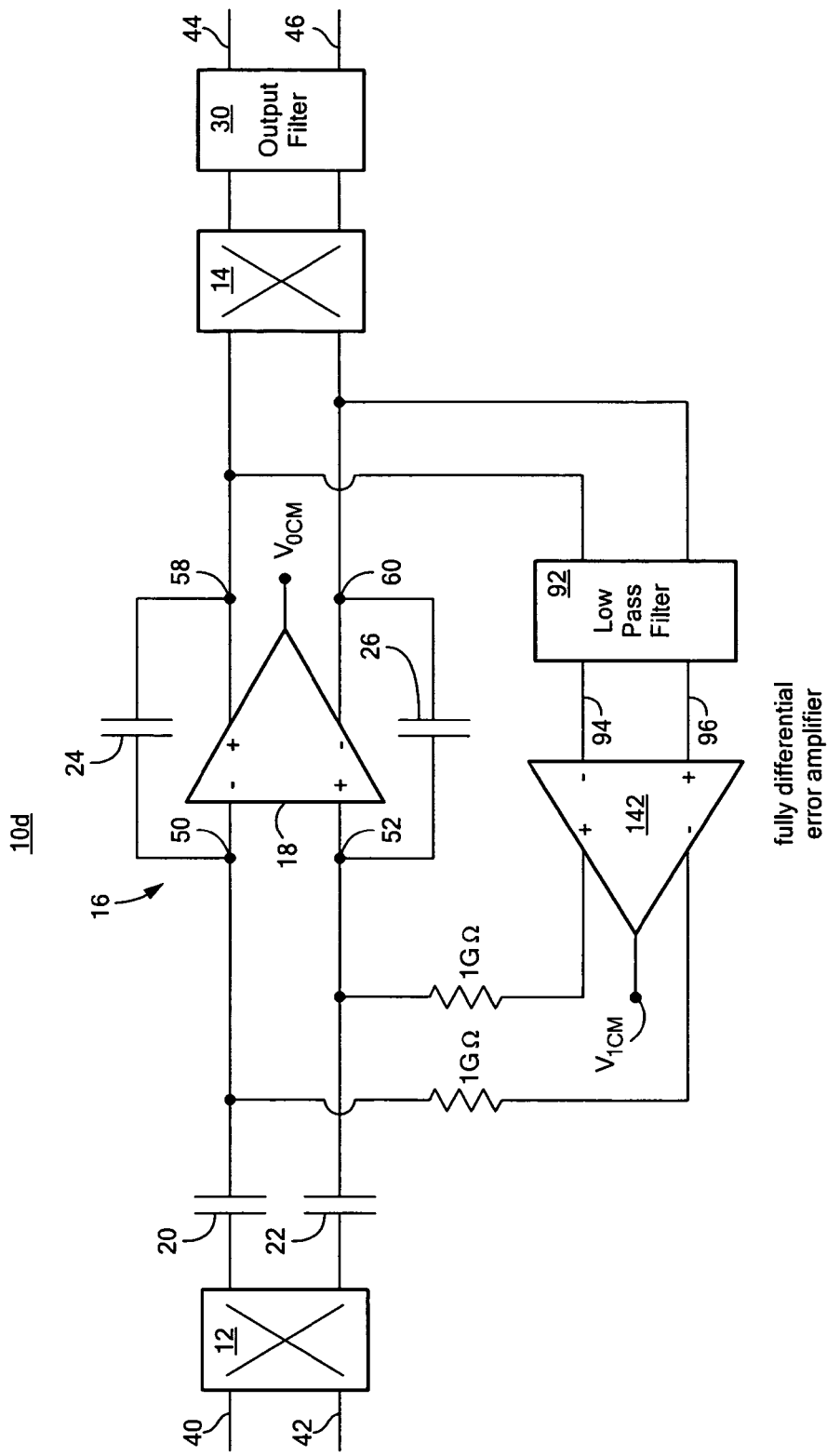
FIG. 6 is a view similar to FIG. 3 showing yet another version of chopped input common mode feedback and offset compensation.

In yet another embodiment error amplifier 142, FIG. 6, can be a fully differential error amplifier. $V_{icm}$ at the output of differential error amplifier 142 is the output common mode voltage of that error amplifier and it is the input common mode voltage for amplifier 18 so this embodiment once again provides a balanced offset cancellation and common mode voltage level application to the differential input of amplifier 18. As shown with reference to FIGS. 3, 4, 5, and 6 there is close control over the input common mode to capacitors 20, 22. This coupled with the ability inherent in every differential amplifier 18 to control its common mode output, enables the system to control both the input and the output common mode levels resulting in a much higher input common mode rejection and a better rail to rail input range.

Figure 7:
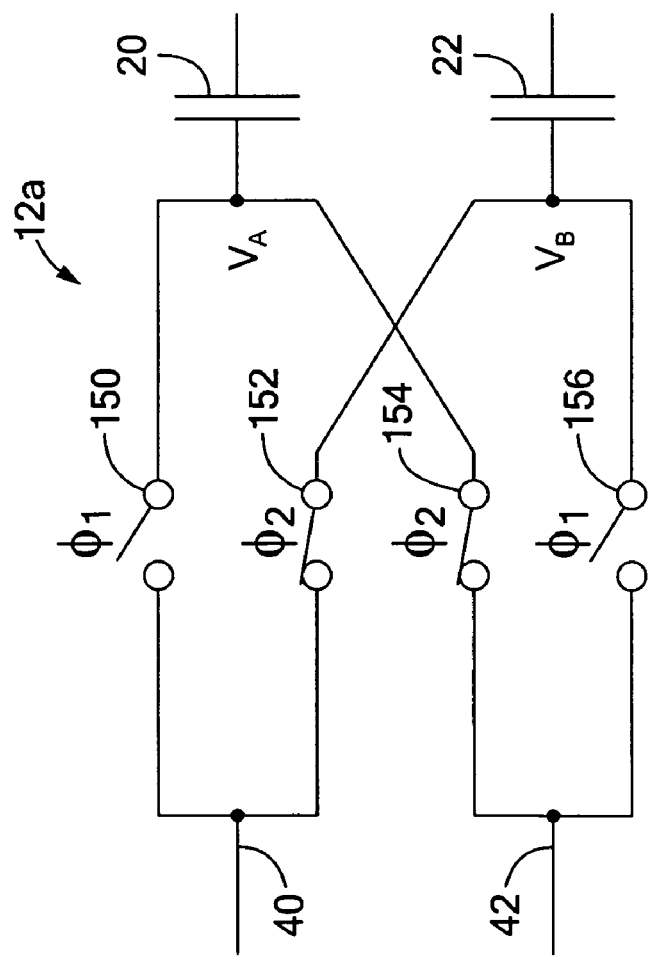
FIG. 7 is a diagram of a typical chopper switch circuit.

As indicated previously chopper switch circuits 12, 14, 126 and 128 may be any variety of swapper circuits or cross point switches. A typical simplified schematic depiction of one is shown in FIG. 7 indicated at 12a as containing four switches 150, 152, 154 and 156. In one phase of the clock signal $F_c$ switches 150 and 156 are open, switches 152 and 154 are closed which provides the cross over mode. In the other phase switches 150 and 156 would be closed and switches 152 and 154 would be open providing the straight through mode.

Figure 8:
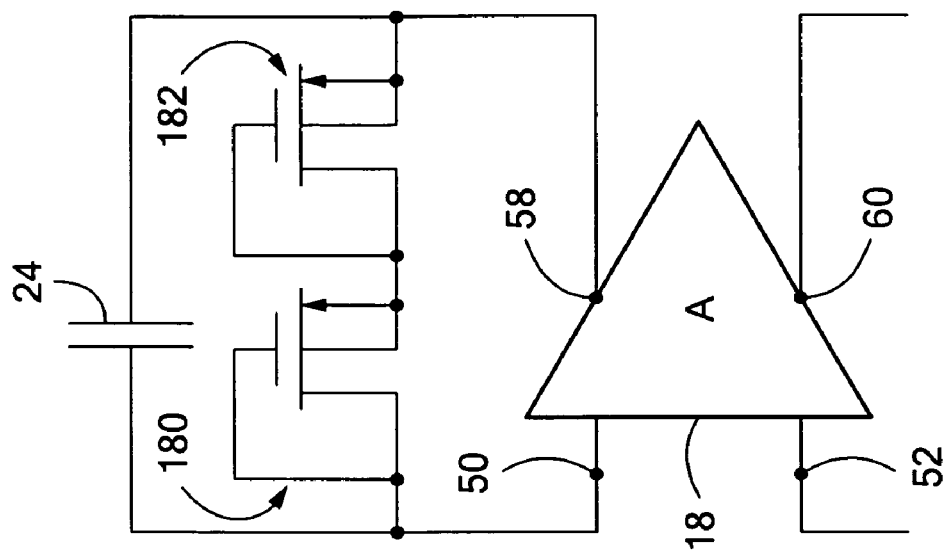
FIG. 8 is a diagram of an amplifier with a typical pseudo resistance element usable in the system of FIG. 1.

Although in FIG. 1 it was disclosed that feedback capacitors 24 and 26 could have high impedance resistances 80 and 82 in parallel with them an alternative to that is the use of pseudo resistances as taught by A LOW-POWER LOW-NOISE CMOS AMPLIFIER FOR NEURAL RECORDING APPLICATIONS by Harrison et al., IEEE Journal of Solid State Circuits, Vol. 38, No. 6, June 2003, pages 958-965 incorporated fully herein by this reference. There a pair of field effect transistors 180, 182, FIG. 8, are connected in series with each other and in parallel with capacitor 24. A similar circuit (not shown) would be used with respect to capacitor 26. Transistors 180 and 182 turn on when there is a difference between the input and output of amplifier 18. They are generally biased to the nearly off position: they conduct a very low current when necessary and approximate a very large impedance in the GΩ range maintaining a unity gain.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A low power, low noise amplifier system comprising:
    a first amplifier having first and second differential input terminals, and first and second differential output terminals for providing a differential output of said first amplifier;
    first and second input capacitors interconnected with said first and second differential input terminals of said first amplifier;
    first and second feedback circuits containing first and second feedback capacitors, respectively, interconnected with said differential input and output terminals of said first amplifier;
    an input chopper switch circuit for receiving a low frequency differential input and selectively, alternately swapping said low frequency differential input through said first and second input capacitors to the first and second differential input terminals of said first amplifier;

an output chopper switch circuit for receiving and selectively, alternately swapping said differential output of said first amplifier synchronously with said input chopper switch circuit;

a low pass filter responsive to said swapped differential output for providing a low noise, low power amplification of said low frequency differential input;

a second amplifier having third and fourth differential input terminals, and third and fourth differential output terminals for providing a differential output of said second amplifier;

third and fourth input capacitors interconnected with said third and fourth differential input terminals; and third and fourth feedback circuits containing third and fourth feedback capacitors, respectively, interconnected with said differential input and output terminals of said second amplifier.

2. The amplifier system of claim 1 in which said first and second feedback circuits include a resistor in parallel with each said first and second feedback capacitors.

3. The amplifier system of claim 1 in which said first and second feedback circuits include a pseudo resistance element in parallel with each said first and second feedback capacitors.

4. The amplifier system of claim 1 in which said input and output chopper switch circuits are switched at a frequency that is substantially higher than a highest frequency component of the low frequency differential input.

5. A low power, low noise amplifier system comprising:

at least one amplifier having first and second differential input terminals, first and second differential output terminals and providing a differential output;

first and second input capacitors interconnected with said first and second differential amplifier input terminals;

first and second feedback circuits containing first and second feedback capacitors, respectively, interconnected with said differential input and output terminals;

an input chopper switch circuit for receiving a low frequency differential input and selectively, alternately swapping said low frequency differential input through said first and second input capacitors to the first and second differential input terminals of said at least one amplifier;

an output chopper switch circuit for receiving and selectively, alternately swapping said differential output synchronously with said input chopper switch circuit;

a low pass filter responsive to said swapped differential outputs for providing a low noise, low power amplification of said low frequency differential inputs; and an analog to digital converter coupled to said low pass filter output, said analog to digital converter having a sampling bandwidth that is greater than the bandwidth of said low pass filter.

6. A low power, low noise amplifier system comprising:

at least one amplifier having first and second differential input terminals, first and second differential output terminals and providing a differential output;

first and second input capacitors interconnected with said first and second differential amplifier input terminals;

first and second feedback circuits containing first and second feedback capacitors, respectively, interconnected with said differential input and output terminals;

an input chopper switch circuit for receiving a low frequency differential input and selectively, alternately swapping said low frequency differential input through said first and second input capacitors to the differential input terminals of said at least one amplifier;

an output chopper switch circuit for receiving and selectively, alternately swapping said differential output synchronously with said input chopper switch circuit;

a low pass filter responsive to said swapped differential outputs for providing a low noise, low power amplification of said low frequency differential inputs; and a common mode feedback and offset cancellation circuit for setting an input common mode level independently of output common mode levels of said at least one amplifier and compensating for amplifier offset of said at least one amplifier.

7. The amplifier system of claim 6 in which said common mode feedback and offset cancellation circuit includes a differential output low pass filter responsive to said amplifier offset, a common mode voltage reference for defining the input common mode level, a summing circuit for combining low pass filter output with the common mode voltage reference, first and second voltage buffers responsive to said summing circuit, and first and second level setting resistors responsive to said first and second buffers, respectively, to apply the combined input common mode level and offset compensation to said first and second differential input terminals.

8. The amplifier system of claim 7 in which said low pass filter includes a pair of capacitors, an input filter chopper circuit for selectively, alternately interconnecting said differential output of said at least one amplifier to said pair of capacitors and an output filter chopper circuit for selectively, alternately interconnecting said pair of capacitors to said summing circuit in synchronism with said input filter chopper circuit and said input and output chopper switch circuits.

9. The amplifier system of claim 6 in which said common mode feedback and offset cancellation circuit includes a common mode voltage reference interconnected with one input terminal of said at least one amplifier to control the input common mode level and an error amplifier responsive to a differential output of said low pass filter interconnected with the other input terminal of said at least one amplifier to compensate for amplifier offset.

10. The amplifier system of claim 5 in which said first and second feedback circuits include a resistor in parallel with each said first and second feedback capacitors.

11. The amplifier system of claim 5 in which said first and second feedback circuits include a pseudo resistance element in parallel with each said first and second feedback capacitors.

12. The amplifier system of claim 5 in which said input and output chopper switch circuits are switched at a frequency that is substantially higher than a highest frequency component of the low frequency differential input.

13. The amplifier system of claim 6 in which said first and second feedback circuits include a resistor in parallel with each said first and second feedback capacitors.

14. The amplifier system of claim 6 in which said first and second feedback circuits include a pseudo resistance element in parallel with each said first and second feedback capacitors.

15. The amplifier system of claim 6 in which said input and output chopper switch circuits are switched at a frequency that is substantially higher than a highest frequency component of the low frequency differential input.

* * * * *